United States Patent [19]
Kim et al.

[11] Patent Number: 6,063,454
[45] Date of Patent: May 16, 2000

[54] IMPEDANCE MATCHING DEVICE FOR SIO₂ COATING DEVICE AND A METHOD OF IMPEDANCE-MATCHING USING THE SAME

[75] Inventors: Sa-hyuk Kim; Sung-sun Baik; Kwang-sung Woo, all of Kumi, Rep. of Korea

[73] Assignee: Samsung Corning Co., Ltd., Suwon-si, Rep. of Korea

[21] Appl. No.: 08/996,107

[22] Filed: Dec. 22, 1997

[30] Foreign Application Priority Data

Jun. 24, 1997 [KR] Rep. of Korea .................. 97/26693

[51] Int. Cl.⁷ .......................... H05H 1/02; H03H 7/38
[52] U.S. Cl. .................. 427/574; 315/111.21; 333/17.3; 333/32
[58] Field of Search ........................... 118/723 E, 723 R; 333/17.3, 32; 315/111.21; 427/562, 563, 569, 574, 578, 579

[56] References Cited

U.S. PATENT DOCUMENTS

| | | | |
|---|---|---|---|
| 5,077,499 | 12/1991 | Oku | 315/111.21 |
| 5,140,223 | 8/1992 | Gesche et al. | 315/111.21 |
| 5,195,045 | 3/1993 | Keane et al. | 333/17.3 |
| 5,345,145 | 9/1994 | Harafuji et al. | 315/111.21 |
| 5,565,737 | 10/1996 | Keane | 315/111.21 |
| 5,770,922 | 6/1998 | Gerrish et al. | 315/111.21 |
| 5,815,047 | 9/1998 | Sorensen et al. | 333/17.3 |

FOREIGN PATENT DOCUMENTS 59-221020  12/1984  Japan .

*Primary Examiner*—Elizabeth McKane
*Assistant Examiner*—Andrew Aldag
*Attorney, Agent, or Firm*—Christie, Parker & Hale, LLP

[57] ABSTRACT

A method of impedance matching for coating $SiO_2$ on a bare glass. The method includes the steps of outputting a matching voltage for matching an impedance of an oscillator with an impedance of a coating unit. A converted voltage is then produced by converting the amplitude of the matched voltage to a predetermined amplitude. The converted voltage is then stabilized and the phase is detected. Next, the phase of the matched voltage is controlled according to the phase of the converted voltage.

4 Claims, 4 Drawing Sheets

IMPEDANCE MATCHING DEVICE FOR SIO₂ COATING DEVICE AND A METHOD OF IMPEDANCE-MATCHING USING THE SAME

BACKGROUND OF THE INVENTION

(1) Field of the Invention

The present invention relates to an impedance matching device for a silicon dioxide ($SiO_2$) coating device and a method of impedance matching using the same, and more particularly, to an impedance matching device having a phase detecting terminal for detecting the phase of a radio frequency (RF) voltage applied to a cathode of the $SiO_2$ coating device.

(2) Description of the Prior Art

Generally, a process of coating $SiO_2$ compound on a bare glass is required for manufacturing a thin film transistor liquid crystal display (TFT-LCD). The coating process is conventionally carried out with a vacuum plasma coating device. As shown in FIG. 1, the vacuum plasma coating device includes an oscillator 100 which produces an RF voltage having a high frequency and amplitude, and a coating unit 300 which coats the bare glass with silicon dioxide by using the RF voltage as a power source. The voltage produced by the oscillator 100 conventionally has a frequency of 13.56 MHz and a 6 KV amplitude.

In addition, an impedance matching device 200 is provided between the oscillator 100 and the coating unit 300 to match the impedance of the oscillator 100 with the impedance of the coating unit 300, thereby increasing the efficiency of the power transmission.

As shown in FIG. 2, the conventional impedance matching device 200 (MB1) includes a coil L1 in which one terminal is connected to one of the input terminals RFIN, a first variable resistor CV1 which is connected to the input terminals RFIN in parallel, and a second variable capacitor CV2 which is provided between a coil L1 and one of the output terminals RFOUT. In operation, when the RF voltage is produced by the oscillator 100, the capacitances of the variable capacitors CV1, CV2 are varied to match the impedance of the oscillator 100 with the impedance of the coating unit 300.

In the impedance matching device 200, the first variable capacitor CV1 is provided for varying the impedance of the load. That is, the load of the coating 15 unit 300 and the impedance matching device 200. The second variable capacitor CV2, which is generally called "a tunning capacitor", is provided for varying the phase of the voltage supplied to the coating unit 300. By using the impedance matching device 200, the voltage produced by the oscillator 100 is effectively transferred to the coating unit 300.

The coating unit 300 includes four cathodes CT1–CT4 which are provided along the direction of movement of the bare glass GLS, as shown in FIG. 3. The silicone dioxide compound is initially adhered on the cathodes CT1–CT4. The case of the coating unit 300 acts as an anode. Ar gas is provided in the case for inducing the discharge between the anode and the cathodes CT1–CT4. In operation, when the bare glass GLS is moved through the coating unit 300, the cathodes are sequentially discharged to coat the bare glass GLS with the silicon dioxide.

When coating the bare glass GLS, the timing of the discharging operations of the cathodes should be accurately controlled. As shown in FIG. 4, the discharging operation timing of the first cathode CT1 and the discharging operation timing of the second cathode CT2 should be controlled so that the phase difference of the voltages on the first and the second cathodes CT1, CT2 is 180°. In addition, the phase difference of the voltages on the second and the third cathodes CT2, CT3 should be maintained to 180°, and the phase difference of the voltages on the third and the fourth cathodes CT3, CT4 should also be maintained to 180°.

If the discharging operation timing of the cathodes CT1–CT4 are not controlled as described above, the silicon dioxide can not be uniformly coated on the bare glass GLS, and the quality of the TFT-LCD is deteriorated. For example, if the second cathode CT2 and the third cathode CT3 are operated concurrently, an arc discharge phenomenon occurs and many pinholes are formed on the coating layer of the glass GLS. Thus, to prevent pinholes from forming on the coating layer, the phase of the voltages on the cathodes CT1–CT4 should be monitored, and the phase difference of voltages on the cathodes CT1–CT4 should be controlled precisely to 180°. For that purpose, a separate probe for detecting the phase is conventionally used. That is, the separate probe is inserted into the coating unit 300 to detect the phase of the voltage, and an oscilloscope is used to analyze the phase of the detected voltage. According to the detected phase, the second variable capacitor CV2 is adjusted to vary the phase of the voltage supplied to the coating unit 300.

However, in order to use the probe, the probe must be inserted into the coating unit 300 manually. That is, an operator must open the cap of the coating unit 300 and insert the probe into the coating unit 300. Thus, it is troublesome for the operator, and furthermore, the operator is liable to receive an electrical shock due to the high voltage supplied to the coating unit 300.

SUMMARY OF THE INVENTION

Accordingly, the present invention is directed to an impedance matching device for a $SiO_2$ coating device and a method of impedance matching using the same which substantially obviates one or more of the problems and disadvantages of the related art. An object of the present invention is to provide a more efficient method of detecting the phase of voltage supplied to cathode of the coating unit. A further object of the present invention is to provide an impedance matching device having a phase detecting terminal for detecting a phase of RF voltage applied to a cathode of a vacuum plasma coating device.

To achieve the above-described objects, an embodiment of the present invention provides a method of impedance matching for coating $SiO_2$ on a bare glass. The method includes outputting a matched voltage which matches the impedance of an oscillator with the impedance of a coating unit. A converted voltage is produced by converting an amplitude of the matched voltage to a predetermined amplitude. The converted voltage is stabilized and the phase is detected. The phase of the matched voltage is then controlled according to the phase of the converted voltage.

An alternative embodiment of the present invention further provides an impedance matching device for $SiO_2$ coating device. The device includes a matching unit for outputting a matching voltage for matching the impedance of a oscillator with the impedance of a coating unit. A voltage converter converts the amplitude of the matched voltage to a predetermined amplitude. A voltage stabilizer stabilizes the converted voltage, and a phase detecting terminal is used for outputting the stabilized converted voltage.

BRIEF DESCRIPTION OF THE DRAWINGS

A more complete appreciation of the invention, and many of the attendant advantages thereof, will be readily apparent and better understood by reference to the following detailed description when considered in conjunction with the accompanying drawings in which like reference symbols indicate the same or similar components, wherein.

DETAILED DESCRIPTION OF THE PREFERRED EMBODIMENT

Preferred embodiments of the present invention will become apparent from a study of the following detailed description with reference to the accompanying drawings.

Figure 1:
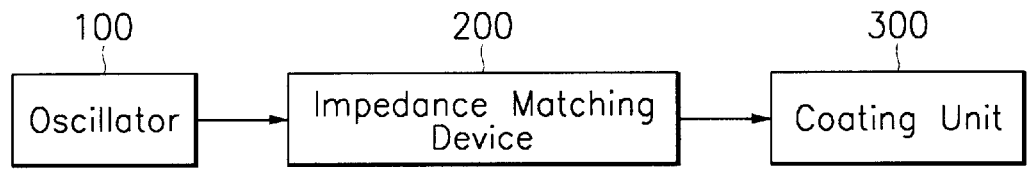
FIG. 1 is a block diagram illustrating the power transmission process in a vacuum plasma coating device.
Figure 2:
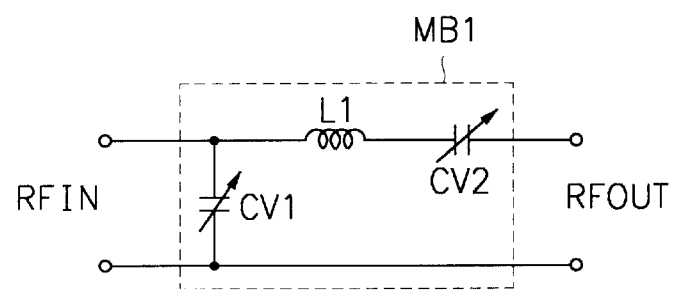
FIG. 2 is a circuit diagram device of a conventional impedance matching device.
Figure 3:
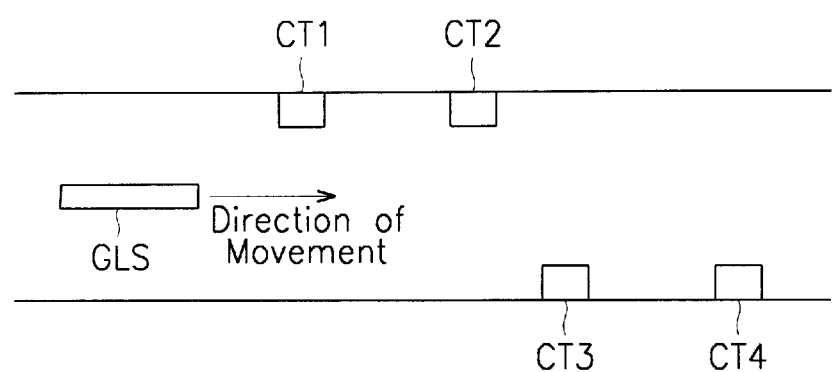
FIG. 3 is a drawing illustrating the coating process in a coating unit.
Figure 4:
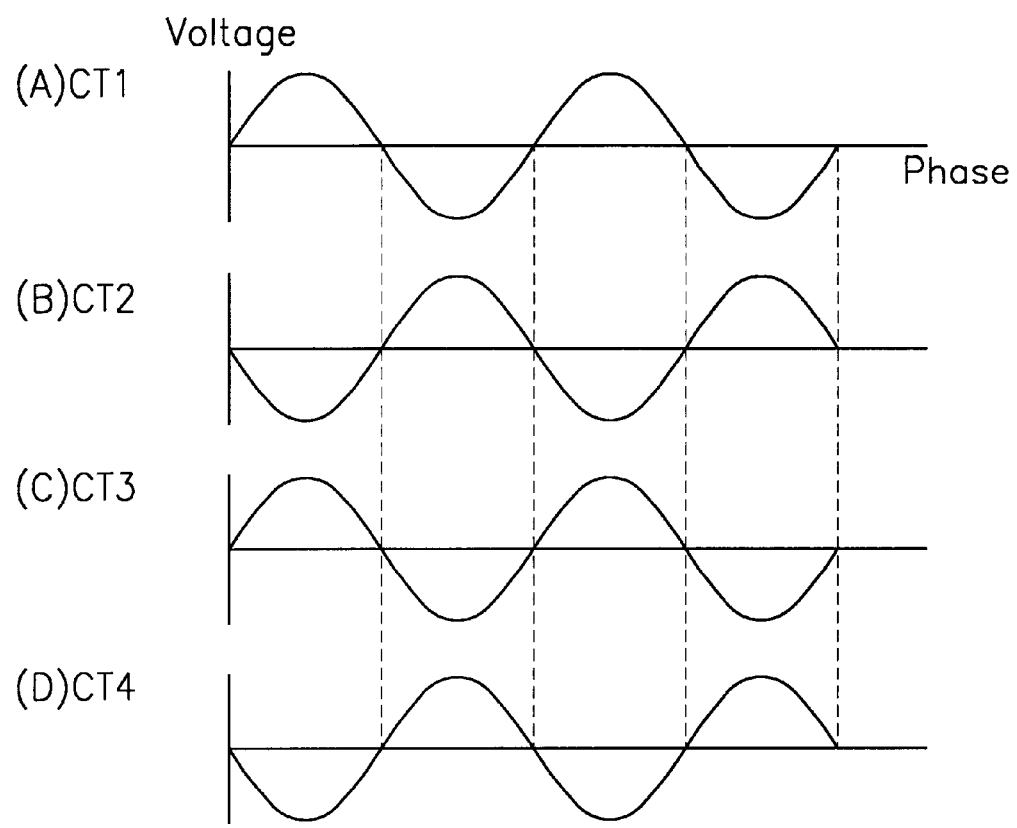
FIG. 4 is a timing diagram showing the phases of voltages on the cathodes CT1–CT4 of a coating device.
Figure 5:
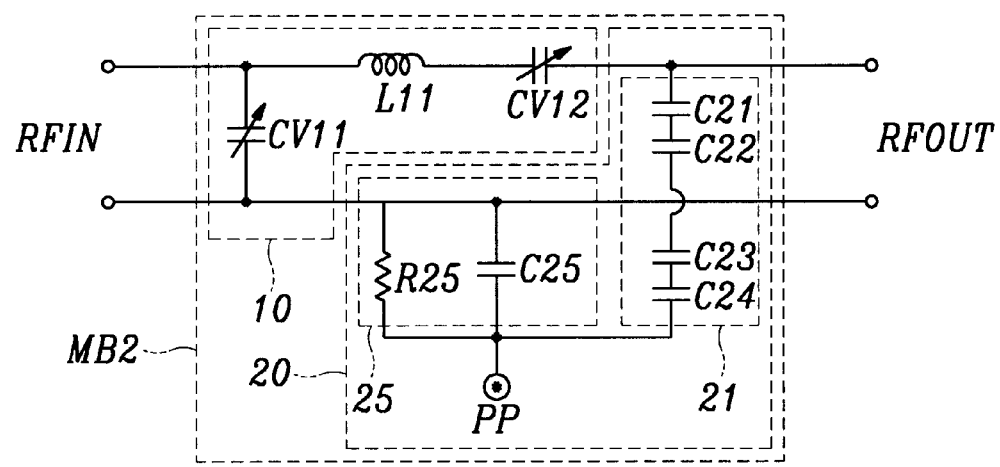
FIG. 5 is a circuit diagram of an impedance matching device used in a coating device according to an embodiment of the present invention.

As shown in FIG. 5, the impedance matching device MB2 according to an embodiment of the present invention includes a matching unit 10 and a phase detector 20. The phase detector 20 has a voltage converter 21, a voltage stabilizer 25 and a phase detection terminal PP.

The matching unit 10 includes a coil L11 with a first terminal connected to one of the input terminals RFIN, a first variable capacitor CV11 connected to the input terminals RFIN in parallel, and a second variable capacitor CV12 with a first terminal connected to a second terminal of the coil L11, and a second terminal connected to one of the output terminals RFOUT. The voltage converter 21 includes first, second, third and fourth capacitors C21, C22, C23, C24 connected in series with one end of the first capacitor C21 connected to the second terminal of the second variable capacitor CV12. The voltage stabilizer 25 includes a fifth capacitor C25 and a resistor R25 connected in parallel between the fourth capacitor C24 and the first variable capacitor CV11.

In operation, an RF voltage is inputted to the matching unit 10 through the input terminals RFIN from the oscillator 100. The matching unit 10 matches the impedances of the oscillator 100 and the coating unit 300 by adjusting the variable capacitors CV11, CV12 so as to effectively transmit power from the oscillator 100 to the coating unit 300. The phase detector 20 detects the phase of the voltage outputted from the matching unit 10. Specifically, the voltage converter 21 of the phase detector 20 changes the amplitude of the voltage outputted from the matching unit 10 with the serially connected capacitors C21, C22, C23, C24 to a suitable input voltage for an oscilloscope. The stabilizing unit 25 of the phase detector 20 filters noise from the changed voltage.

With the phase detector 20, an operator can detect the phase of the converted voltage on the phase detecting terminal PP, and calculate the phase of the voltage on the cathode with the detected phase of the converted voltage. Then, the phase of the voltage on the output terminal RFOUT is controlled by the second variable capacitor CV12 according to the phase of the detected voltage.

Figure 6:
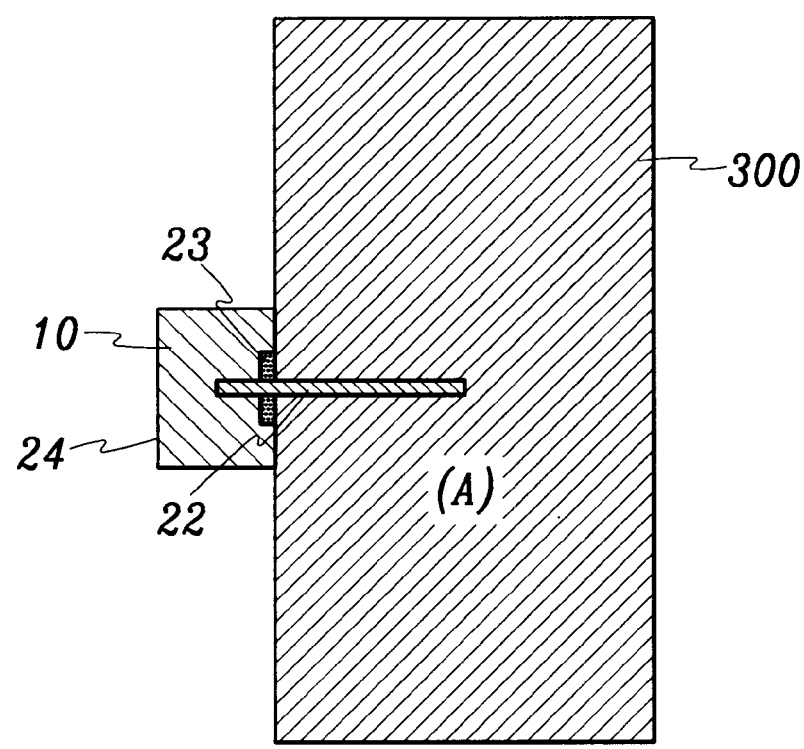
FIG. 6 is a side sectional view of a coating unit assembled with the impedance matching device according to an embodiment of the present invention.

Since the phase detector 20 is incorporated in the impedance matching device MB2, the structure of the coating device can be effectively changed. In FIG. 6, the matching unit 10 is mounted in a matching box 24, and a cathode 22 is connected to one of the output terminals RFOUT (not shown) of the matching unit 10. The matching box 24 and the case of the coating unit 300 are electrically connected to the other output terminal RFOUT (not shown) of the matching unit 10. The matching box 24 and the cathode 22 are isolated and separated from each other by an isolation member 23. The cathode is inserted into the coating unit 300 to induce a discharge in the coating unit 300. In prior coating devices, since the matching box was mounted on the edge part of the coating device to provide a space for the probe, a curved or bent cathode was required to induce a discharge at the center portion of the coating unit 300. But in a preferred embodiment of the present invention, since the matching box 24 is mounted on the center part of the coating device 300, a strait cathode 22 can be used to induce a discharge at the center portion A of the coating unit 300. Thus, the power loss due to the bent cathode is prevented.

In FIG. 6, the reference character A represents a space for coating the bare glass. Preferably, the cathode 22 is manufactured to have a width of 70 mm so that the RF voltage can be easily transmitted. The isolation member 23 preferably has a circular disk shape so that the insulation between the cathode 22 and matching box 24 can be maintained despite the voltage supplied to the cathode 22.

Thus, by incorporating the phase detector into the impedance matching device, an operator can easily and safely detect the phase of voltage supplied to the cathode.

What is claimed is:

1. A method for impedance matching an oscillator with a coating unit when coating $SiO_2$ on bare glass, comprising the steps of:

generating an impedance matching voltage for matching an impedance of the oscillator with an impedance of the coating unit;

producing a converted voltage by converting an amplitude of the impedance matching voltage to a predetermined amplitude;

stabilizing the converted voltage;

detecting a phase of the converted voltage; and controlling a phase of the impedance matching voltage according to the phase of the detected converted voltage, wherein the step of producing a converted voltage is performed by transmitting the impedance matching voltage through a plurality of capacitors connected in series.

2. A method for impedance matching an oscillator with a coating unit when coating $SiO_2$ on bare glass, comprising the steps of:

generating an impedance matching voltage for matching an impedance of the oscillator with an impedance of the coating unit;

producing a converted voltage by converting an amplitude of the impedance matching voltage to a predetermined amplitude;

stabilizing the converted voltage;

detecting a phase of the converted voltage; and controlling a phase of the impedance matching voltage according to the phase of the detected converted voltage, wherein the step of stabilizing the converted voltage is performed by transmitting the converted voltage through a capacitor and a resistor connected in parallel.

3. An impedance matching device for a SiO$_2$ coating device, comprising:

a matching unit for matching an impedance of an oscillator with an impedance of a coating unit and for outputting an impedance matching voltage, wherein the matching unit has a coil having a first terminal connected to one input terminal of the matching unit, a first variable capacitor connected in parallel to said one of the input terminals and another input terminal of the matching unit, and a second variable capacitor having a first terminal connected to a second terminal of the coil and a second terminal connected to one output terminal of the matching unit;

a voltage converter for producing a converted voltage by converting an amplitude of the impedance matching voltage to a predetermined amplitude;

a voltage stabilizer for stabilizing the converted voltage; and a phase detecting terminal for outputting the converted voltage, wherein the voltage converter comprises first, second, third and fourth capacitors connected in series, one end of the first capacitor being connected to the second terminal of the second variable capacitor.

4. An impedance matching device according to claim 3, wherein the voltage stabilizer comprises a fifth capacitor and a resistor connected in parallel between the fourth capacitor and the first variable capacitor.

* * * * *